United States Patent
Akaike et al.

(10) Patent No.: US 8,803,179 B2
(45) Date of Patent: Aug. 12, 2014

(54) SEMICONDUCTOR LIGHT EMITTING DEVICE

(71) Applicant: Kabushiki Kaisha Toshiba, Tokyo (JP)

(72) Inventors: Yasuhiko Akaike, Ishikawa (JP); Shinji Nunotani, Ishikawa (JP); Kazuyoshi Furukawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/779,114

(22) Filed: Feb. 27, 2013

(65) Prior Publication Data

US 2014/0061696 A1 Mar. 6, 2014

(30) Foreign Application Priority Data

Aug. 31, 2012 (JP) ................ P2012-191249

(51) Int. Cl.
*H01L 33/00* (2010.01)

(52) U.S. Cl.
USPC ........... 257/98; 257/99; 257/E33.064; 438/29

(58) Field of Classification Search
USPC ............ 257/79, 98, 99, E33.064; 438/22, 29
See application file for complete search history.

(56) References Cited

U.S. PATENT DOCUMENTS

| | | | |
|---|---|---|---|
| 8,004,000 B2* | 8/2011 | Min et al. | 257/98 |
| 8,384,094 B2* | 2/2013 | Kim | 257/82 |
| 8,426,878 B2* | 4/2013 | Yasuda et al. | 257/91 |
| 8,563,997 B2* | 10/2013 | Cheong | 257/97 |
| 2005/0082555 A1* | 4/2005 | Chien et al. | 257/94 |
| 2008/0173885 A1* | 7/2008 | Kuromizu | 257/98 |
| 2012/0138999 A1 | 6/2012 | Okabe et al. | |

FOREIGN PATENT DOCUMENTS

| | | |
|---|---|---|
| JP | 2005-197289 | 7/2005 |
| JP | 2007-258323 | 10/2007 |
| JP | 2010-161198 | 7/2010 |
| JP | 2011-071316 | 4/2011 |

* cited by examiner

*Primary Examiner* — Tuan N. Quach

(74) *Attorney, Agent, or Firm* — Patterson & Sheridan, LLP

(57) ABSTRACT

A semiconductor light emitting device is provided that includes a support substrate, a first metal layer formed on the support substrate, a transparent conductive layer formed on the first metal layer, a second metal layer embedded in the transparent conductive layer, and a semiconductor light emitting layer formed on the transparent conductive layer. A reflectance of the second metal layer to light emitted by the semiconductor light emitting layer is higher than a reflectance of the first metal layer to light emitted by the semiconductor light emitting layer.

20 Claims, 11 Drawing Sheets

US 8,803,179 B2

SEMICONDUCTOR LIGHT EMITTING DEVICE

CROSS-REFERENCE TO RELATED APPLICATION

This application is based upon and claims the benefit of priority from Japanese Patent Application No. 2012-191249, filed Aug. 31, 2012; the entire contents of which are incorporated herein by reference.

FIELD

Embodiments described herein relate generally to a semiconductor light emitting device.

BACKGROUND

In recent years, technology has been developed to produce a thin film-type light emitting device (LED) in which a semiconductor light emitting layer is grown on a crystal substrate, which is eliminated after the semiconductor light emitting layer is pasted together with the support substrate through a binding metal layer. In these thin film-type LEDs, the binding metal layer functions as a light reflecting layer, which reflects the light emitted from the semiconductor light emitting layer to the support substrate. Also, between the binding metal layer and the semiconductor light emitting layer, a transparent conductive layer is formed in order to prevent the alloying of the two layers. Unfortunately, dicing procedures cause unwanted pealing to occur on layers near where the metal reflecting layer makes contact with the dicing blade.

DETAILED DESCRIPTION

A semiconductor light emitting device according to an embodiment includes a support substrate, a first metal layer formed on the support substrate, a transparent conductive layer formed on the first metal layer, a second metal layer embedded in the transparent conductive layer, such that edges of the second metal layer are not exposed, and a semiconductor light emitting layer formed on the transparent conductive layer.

First Embodiment

Figure 1A:
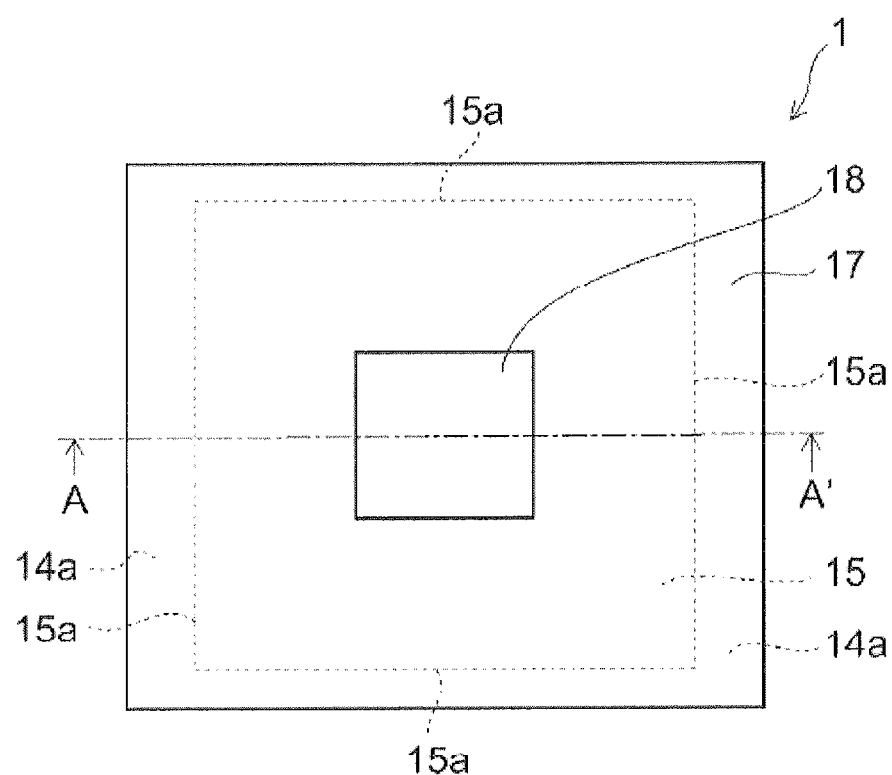
FIG. 1A is a plane drawing showing an example of a semiconductor light emitting device of a first embodiment.
Figure 1B:
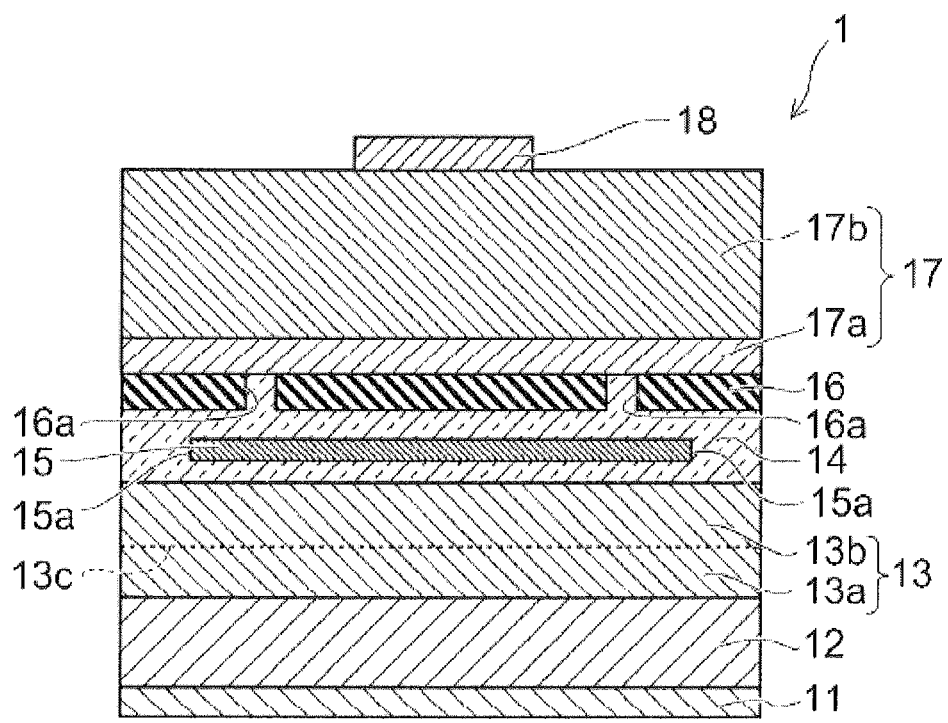
FIG. 1B is a cross section along A-A' line shown in FIG. 1A.

FIG. 1A is a plane drawing showing an example of a semiconductor light emitting device of a first embodiment, and FIG. 1B is a cross section of FIG. 1A along the A-A' line. The semiconductor light emitting device of the first embodiment is a thin film-type LED.

As shown in FIGS. 1A and 1B, in a semiconductor light emitting device 1 of the first embodiment, a lower electrode 11, a support substrate 12, a binding metal layer 13 (e.g., first metal layer), a transparent conductive layer 14, a transparent insulating layer 16, a semiconductor light emitting layer 17 and an upper electrode 18 are layered in this order. Inside the transparent conductive layer 14, a reflective metal layer 15 (e.g., second metal layer) is embedded. Seen from the direction of layering of each layer, the shape of the semiconductor light emitting device 1 is, for example, a square with sides of 350 μm.

The lower electrode 11 is composed of, for example, a metal. Seen from the direction of layering of each layer, the lower electrode 11 is formed in the entirety of the semiconductor light emitting device 1. The support substrate 12 is composed of a conductive material, such as single crystal silicon (Si). The binding metal layer 13 is composed of, for example, gold (Au). In the binding metal layer 13, an upper layer 13b is layered on top of a lower layer 13a, and sometimes at an interface 13c between the lower layer 13a and the upper layer 13b, a void exists (not shown). The thickness of the lower layer 13a and the upper layer 13b is, for example, 500 nm each.

The transparent conductive layer 14 is composed of a transparent conductive material such as ITO (indium-tin-oxide). The thickness of the transparent conductive layer 14 is, for example 200 nm. Here, in this detailed description "transparent" includes semitransparent.

The reflective metal layer 15 is composed of, for example, a material selected from the group consisting of silver (Ag) and a silver alloy. The thickness of the reflective metal layer 15 is high enough to be able to obtain a reflectance equal to the bulk and thin enough to be embedded in the transparent conductive layer 14. The thickness of the reflective metal layer 15 is, for example, 50 nm or more. In the semiconductor light emitting device 1, only the reflective metal layer 15 is formed and is formed continuously in the area of the transparent conductive layer 14 except for an edge 14a. Therefore, an edge border 15a of the reflective metal layer 15 is completely covered by the transparent conductive layer 14 and is not exposed on the side of the semiconductor light emitting device. The width of edge 14a is, for example 10-20 μm.

The transparent insulating layer 16 includes a transparent insulating material, for example, UDO (undoped oxide, a silicon oxide to which no impurities are added.) The thickness of transparent insulating layer 16 is high enough to achieve insulation properties and thin enough to achieve transparency, which is, for example, 50 nm. Also, an opening 16a is formed in the transparent insulation layer 16. For example, the transparent insulating layer 16 is selectively formed between the transparent conductive layer 14 and the semiconductor light emitting layer 17. The transparent conductive layer 14 advances into the opening 16a, and is connected to the semiconductor light emitting layer 17 in the opening 16a. Also, in the nadir and the surrounding area of the opening 16a, the reflective metal layer 15 is formed. The transparent conductive layer 14 and the transparent insulating layer 16 prevent the occurrence of alloying reactions between the binding metal layer 13 and the semiconductor light emitting layer 17.

In the semiconductor light emitting layer 17, an InGaAlP layer 17b, which is composed of InGaAlP (Indium Gallium Aluminum Phosphorus) is layered on top of a GaP layer 17a, which is composed of GaP (Gallium Phosphorus). The semiconductor light emitting layer 17 is, for example, an LED layer that emits red light.

The upper electrode 18 is arranged on only part of the semiconductor light emitting layer 17. Therefore, even though part of the upper side of the semiconductor light emitting layer 17 is covered by the upper electrode 18, the remaining part is not covered by the upper electrode 18.

Next, the production method of the semiconductor light emitting device of the first embodiment is explained below.

FIG. 2A2C, FIGS. 3A-3C, and FIGS. 4A-4C are cross sections, showing examples of a production of the semiconductor light emitting device of the first embodiment. In these figures, the top-bottom direction is reversed relative to FIGS. 1A and 1B.

Figure 2A:
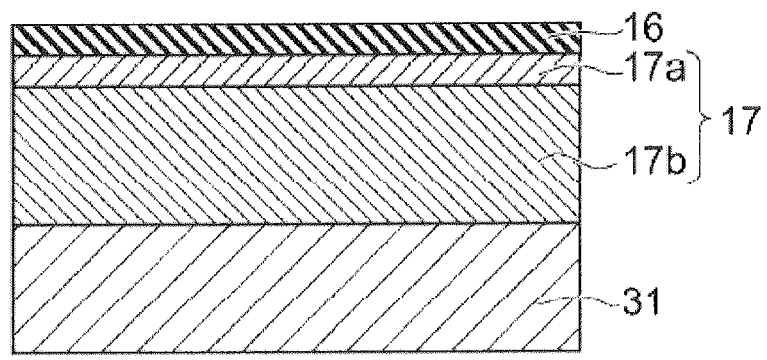
FIGS. 2A-2C are cross sections, showing an example of a production method of the semiconductor light emitting device of the first embodiment.

As shown in FIG. 2A, crystal growing substrate 31 is prepared. The crystal growing substrate 31 is, for example, a part of a GaAs (gallium arsenide) wafer. In the following processes, multiple semiconductor light emitting devices are simultaneously formed on the GaAs wafer, but one semiconductor light emitting device is explained below as an example.

First, on the crystal growing substrate 31, the epitaxial growth of the InGaAlP layer 17b occurs. Next, the epitaxial growth of the GaP layer 17a occurs. In this way, the semiconductor light emitting layer 17 is formed. Next, by accumulating silicon oxides, the transparent insulating layer 16 is formed.

Figure 2B:
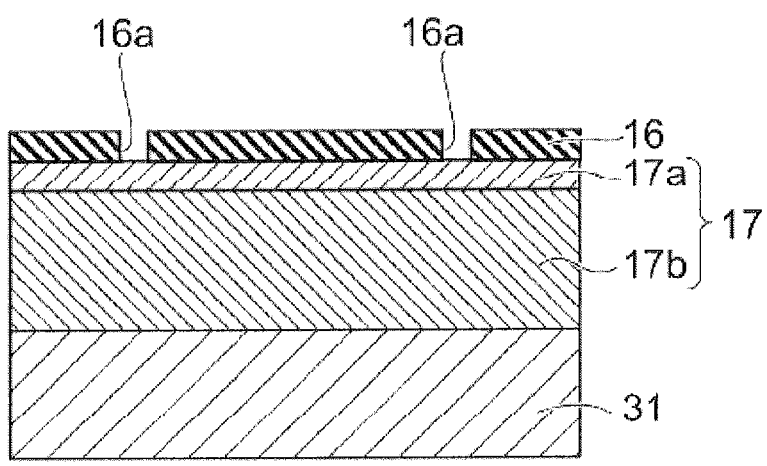

As shown in FIG. 2B, by etching, the opening 16a is then formed in the transparent insulating layer 16.

Figure 2C:
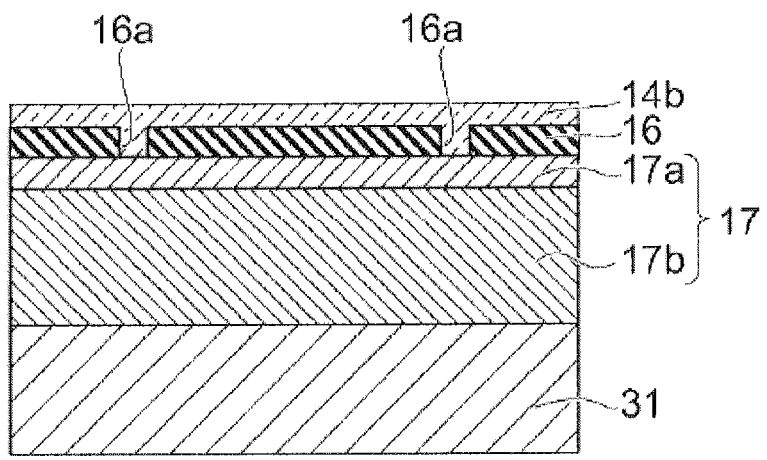

Next, as shown in FIG. 2C, by, for example, a sputtering method, ITO is accumulated to form a lower layer 14b of the transparent conductive layer. The thickness of the lower layer 14b is, for example, 100 nm. Here, the lower layer 14b is also embedded in the opening 16a, and is in contact with the semiconductor light emitting layer 17.

Figure 3A:
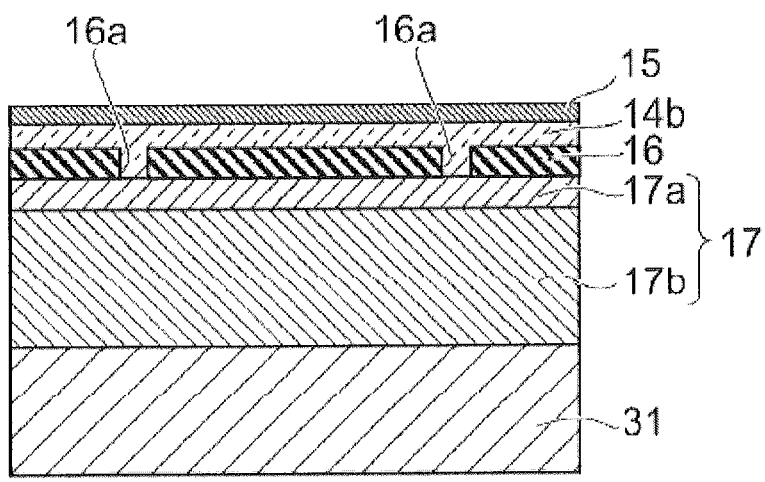
FIGS. 3A-3C are cross sections, showing an example of the production method of the semiconductor light emitting device of the first embodiment.

Next, as shown in FIG. 3A, using the sputtering method, for example, silver (Ag) is accumulated to form the reflective metal layer 15 on the entire surface of the lower layer 14b of the transparent conductive layer.

Figure 3B:
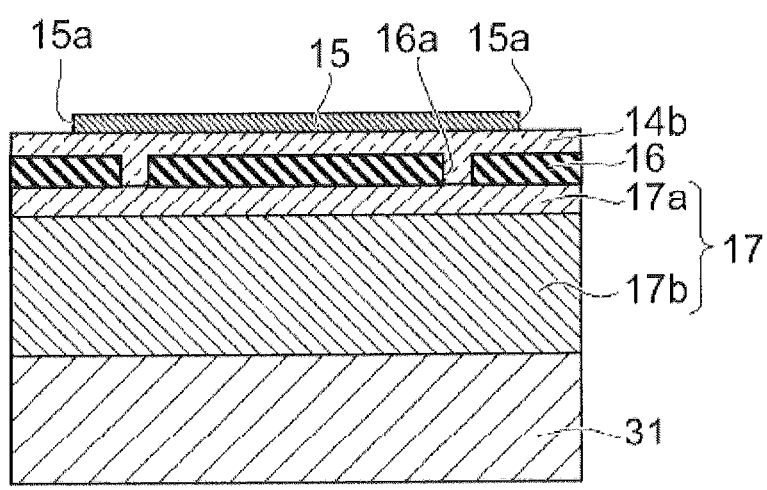

As shown in FIG. 3B, by etching, the edge of the reflective metal layer 15 is then removed. This etching can be either wet-etching or dry-etching. However, depending on the quality of the film of the lower layer 14b, there is a possibility that the etchant used in wet-etching may permeate into the lower layer 14b. In such a case, it is preferable to process the reflective metal layer 15 by dry-etching.

In the first embodiment, one reflective metal layer 15 is arranged in the area in which one semiconductor light emitting device is to be formed. And seen from the direction of layering, the edge border 15a of the reflective metal layer 15 is positioned inside the edge border of the area where each semiconductor light emission device is to be formed. However, on a GaAs wafer, which is an assembly of the crystal growing substrates 31, the multiple semiconductor light emitting devices are formed, so on one GaAs wafer, the multiple reflective metal layers 15 are positioned, while separated from one another.

Figure 3C:
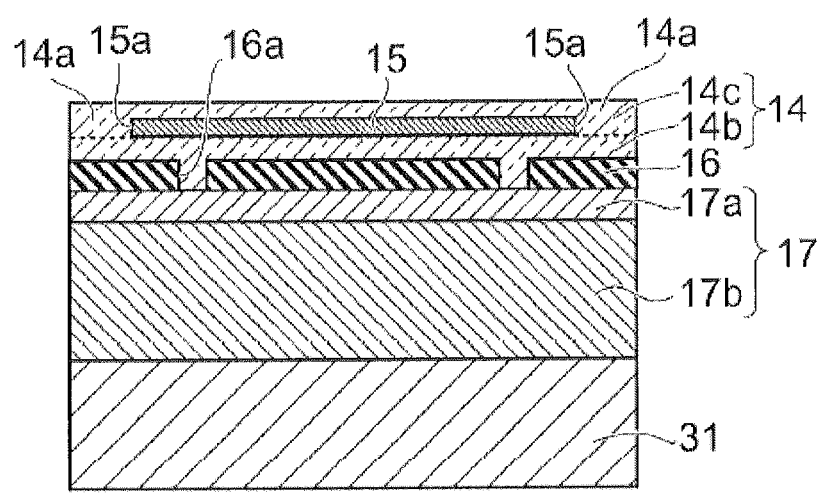

Next, as shown in FIG. 3C, using the sputtering method, for example, ITO is accumulated to form an upper layer 14c of the transparent conductive layer. The thickness of the upper layer 14c is, for example, 100 nm. In this way, the transparent conductive layer 14 is formed. Here, the upper layer 14c covers the upper and side surfaces of the reflective metal layer 15. At the side of the reflective metal layer 15, the upper layer 14c comes in contact with the lower layer 14b and two layers are integrated to become the edge 14a of the transparent conductive layer 14. In this way, the reflective metal layer 15 becomes embedded in the transparent conductive layer 14, and the entire part of the edge border 15a of the reflective metal layer 15 is covered by the transparent conductive layer 14.

Figure 4A:
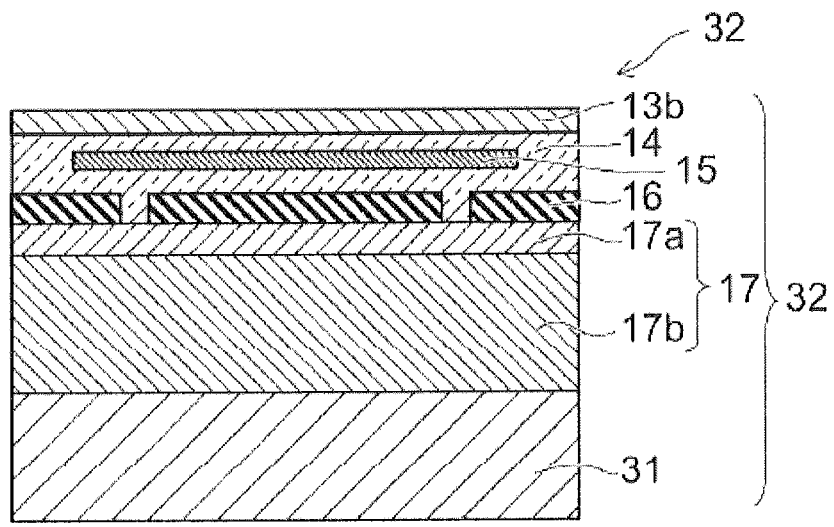
FIGS. 4A-4C are cross sections, showing an example of the production method of the semiconductor light emitting device of the first embodiment.

Next, as shown in FIG. 4A, by accumulating gold (Au) on the transparent conductive layer 14, the upper layer 13b of the binding metal layer is formed. In this way, on crystal growing substrate 31, the semiconductor light emitting layer 17, the transparent insulating layer 16, the transparent conductive layer 14 and the upper layer 13b are layered in this order, producing a structure 32, in which the reflective metal layer 15 is embedded in the transparent conductive layer 14.

Figure 4B:
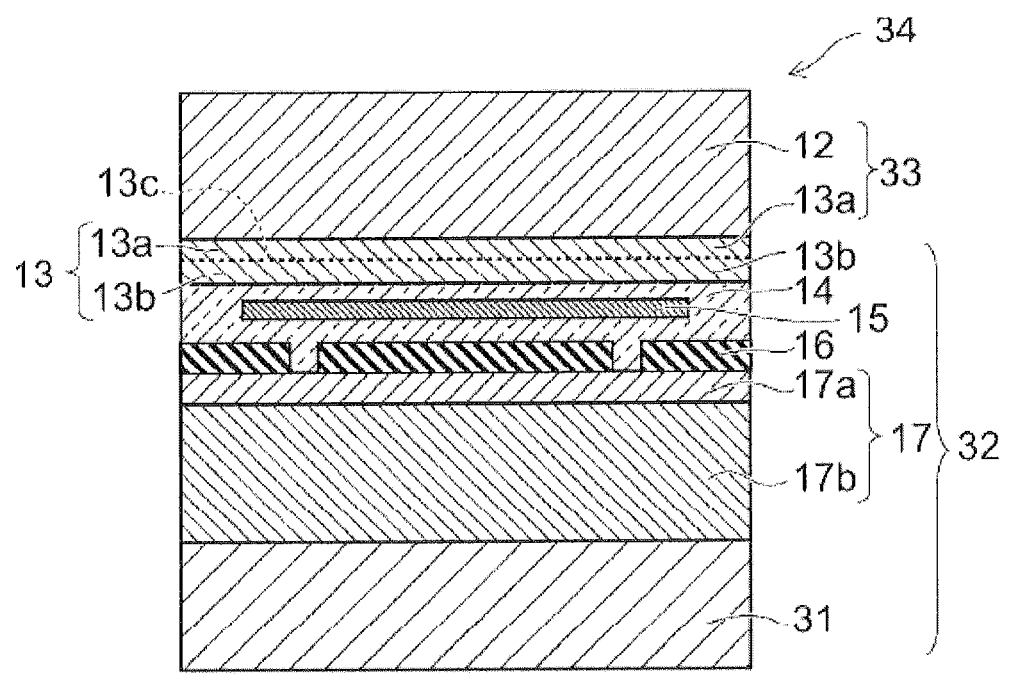

On the other hand, as shown in FIG. 4B, the support substrate 12 is prepared. The support substrate 12 is, for example, part of a silicon wafer. Next, gold is accumulated on the support substrate 12, and the lower layer 13b of binding the metal layer 13a is formed. In this way, a structure 33, in which the lower layer 13a is formed on the support substrate 12, is produced.

The structure 32 and the structure 33 are superposed in such a way that the upper layer 13b and the lower layer 13a come into contact. In this state, heat treatment is applied to join the upper layer 13b and the lower layer 13a. In this way, the upper layer 13b and lower layer 13a are integrated to become the binding metal layer 13. As a result, structure 34 is produced, in which the semiconductor light emitting layer 17, the transparent insulating layer 16, the transparent conductive layer 14, the binding metal layer 13 and the support substrate 12 are layered in this order on crystal growing substrate 31. Here, there is the possibility that a void is then formed at the interface 13c of the lower layer 13a and the upper layer 13b of the binding metal layer 13(not shown).

Figure 4C:
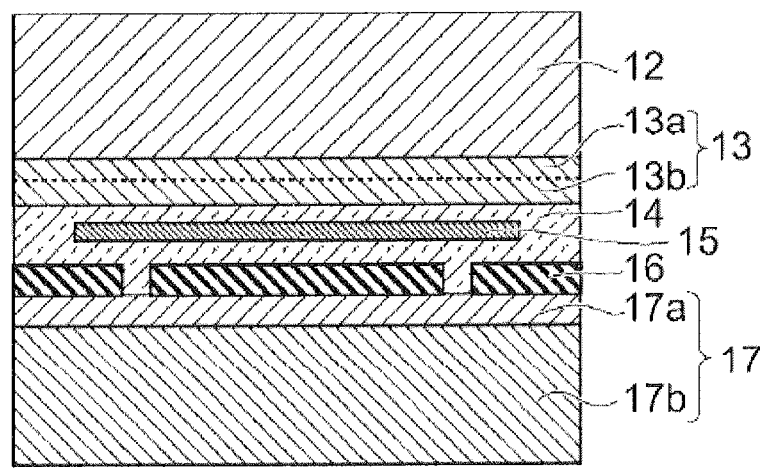

Next, as shown in FIG. 4C, by wet etching and other methods, crystal growing substrate 31 is removed from structure 34. In this way, the semiconductor light emitting layer 17 becomes exposed.

As shown in FIG. 1A and FIG. 1B, the lower electrode 11 is then formed at the bottom surface of the support substrate 12. The upper electrode 18 is selectively formed at the top surface of the semiconductor light emitting layer 17.

Next, dicing is performed using a blade (not shown) to break the layered structure into pieces. Here, the blade passes through the part where the transparent conductive layer 14 does not contain the reflective metal layer 15. In this way, the semiconductor light emitting device 1 is produced. Advantageously, the dicing blade does not cause pealing because the dicing blade does not make contact with the reflective metal layer 15.

Next, an operation of the semiconductor light emitting device of the first embodiment is explained below.

As shown in FIG. 1A and FIG. 1B, in the semiconductor light emitting device 1, if a voltage is applied between the lower electrode 11 and the upper electrode 18, electric power is supplied to the semiconductor light emitting layer 17, causing semiconductor light emitting layer to emit, for example, red light. At this time, the current that flows from the lower electrode 11 to the semiconductor light emitting layer 17 passes through the opening 16a of the transparent insulating layer 16. For example, the transparent insulating layer 16 functions as a current stenosis layer, which limits the path of the current that flows from the lower electrode 11 to the semiconductor light emission layer 17.

Also, most of the light emitted above the semiconductor light emitting layer 17, namely toward the opposite side to the support substrate 12, is emitted without change from the semiconductor light emitting device 1. On the other hand, most of the light emitted below the semiconductor light emitting layer 17, namely toward the side of the support substrate 12, passes through the transparent insulating layer 16, then passes over the area in the transparent conductive 14, except for the edge 14a, reaching the reflective metal layer 15, and is reflected by the reflective metal layer 15, then moves upward. Also, part of the light that entered the edge 14a of the transparent conductive layer 14, after being emitted downward from the semiconductor light emitting layer 17, is reflected by the binding metal layer 13 and moves upward.

Next, the effect of the first embodiment is explained. In the first embodiment, because the binding metal layer 13 is composed of gold, in the binding process shown in FIG. 4B, the structures 32 and 33 have a superior bondability.

Also, in the first embodiment, because the reflective metal layer 15 is embedded in the transparent conductive layer 14, even if the reflective metal layer 15, composed of silver, and the transparent conductive layer 14, composed of ITO, have an inferior adhesion, it is hard for the reflective metal layer 15 to separate from the transparent conductive layer 14. Therefore, the semiconductor light emitting device 1 has a high mechanical stability.

In particular, because the reflective metal layer 15 is not positioned in the edge 14a of the transparent conductive layer 14, during dicing, a blade does not pass through the interface of the transparent conductive layer 14 and the reflective metal layer 15. Accordingly, it is possible to prevent separation of the interface, which would start at the intersection of the interface of the transparent conductive layer 14 and the reflective metal layer 15, and the processed surface by the blade. Advantageously, the dicing blade does not cause pealing because the dicing blade does not make contact with the reflective metal layer 15. Thus, the semiconductor light emitting device 1 has a high productivity.

Here, regarding the width of the edge 14a, in which the reflective metal layer 15 is not positioned, from the standpoint of light reflectance, it is preferable for the edge 14a to be narrow because in that way the adhesion is ensured between the lower layer 14b and the upper layer 14c of the transparent conductive layer 14. However, the edge 14a is limited by the level of processing precision during the patterning of the reflective metal layer 15 and the level of precision of dicing.

On the other hand, in the first embodiment, the reflective metal layer 15 is composed of silver. As mentioned above, most of the light emitted downward from the semiconductor light emitting layer 17 is reflected by the reflective metal layer 15. Also, the reflectance of silver to a visible light is approximately 95%, and the reflectance of gold to a visible light is approximately 90%. Accordingly, the reflectance of the reflective metal layer 15 to the light emitted by the semiconductor light emitting layer 17 is higher than the reflectance of the binding metal layer 13 to the light emitted by the semiconductor light emitting layer 17. Thus, the semiconductor light emitting device 1 of the first embodiment has high light extraction efficiency.

Also, in the first embodiment, because the reflective metal layer 15 is formed in the entirety of the transparent conductive layer 14, except for the edge 14a, it is possible to efficiently reflect the light emitted by the semiconductor light emitting layer 17.

Further, the current that flows from the lower electrode 11 to the semiconductor light emitting layer 17 passes through the opening 16a of the transparent insulating layer 16, so that the semiconductor light emitting layer 17 emits light intensively in the area directly above the opening 16a and the peripheries of the opening 16a. The reflective metal layer 15 is formed in the area directly below the opening 16a and the periphery of the opening 16a, so the reflective metal layer 15 can effectively reflect the light emitted from the semiconductor light emitting layer 17.

In this way, the semiconductor light emitting device of the first embodiment can achieve a good adhesion because the binding metal layer 13 is composed of gold. Also, the semiconductor light emitting device can achieve a good light reflective property because the reflective metal layer 15 is composed of silver. Also, the semiconductor light emitting device can achieve a high mechanical strength during the production process and after production because the reflective metal layer 15 is embedded in the transparent conductive layer 14. As a result, high productivity and high light extraction efficiency can be simultaneously achieved.

On the other hand, if the reflective metal layer 15 is not formed, most of the light emitted from the semiconductor light emitting layer 17 is reflected by the binding metal layer 13, composed of gold. However, the reflectance of gold to visible light is approximately 90%, and lower than the reflectance of silver, which is approximately 95%. In this case, the light extraction efficiency is low. Semiconductor light emitting device 1 of the first embodiment can improve the brightness by 12% to 13%, compared to semiconductor light emitting devices without the reflective metal layer 15.

Also, if the reflective metal layer 15 is not formed and the binding metal layer 13 is composed of silver, because silver is more easily oxidized than gold, during the process shown in FIG. 4B, it is difficult to achieve a good adhesion. Therefore, the productivity of the semiconductor light emitting device declines.

Further, it is possible to form the reflective metal layer 15, composed of silver, on the entire surface of the binding metal layer 13, composed of gold. It is also possible to form the transparent conductive layer 14, composed of ITO, over the entire surface of the reflective metal layer 15. However, in this case, the adhesion between silver and ITO is low, so the interface of the reflective metal layer 15 and the transparent conductive layer 14 is vulnerable. Therefore, the interface of the reflective metal layer 15 and the transparent conductive layer 14 is more easily separated, lowering the productivity. Also, the reliability of the product also declines.

Second Embodiment

Figure 5A:
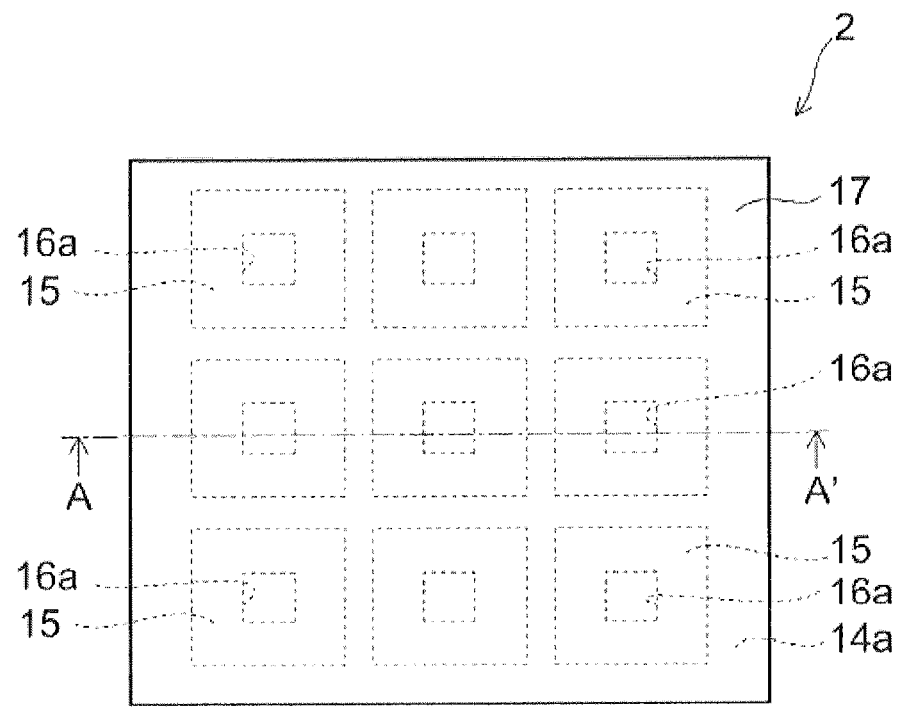
FIG. 5A is a plane drawing showing an example of a semiconductor light emitting device of a second embodiment.
Figure 5B:
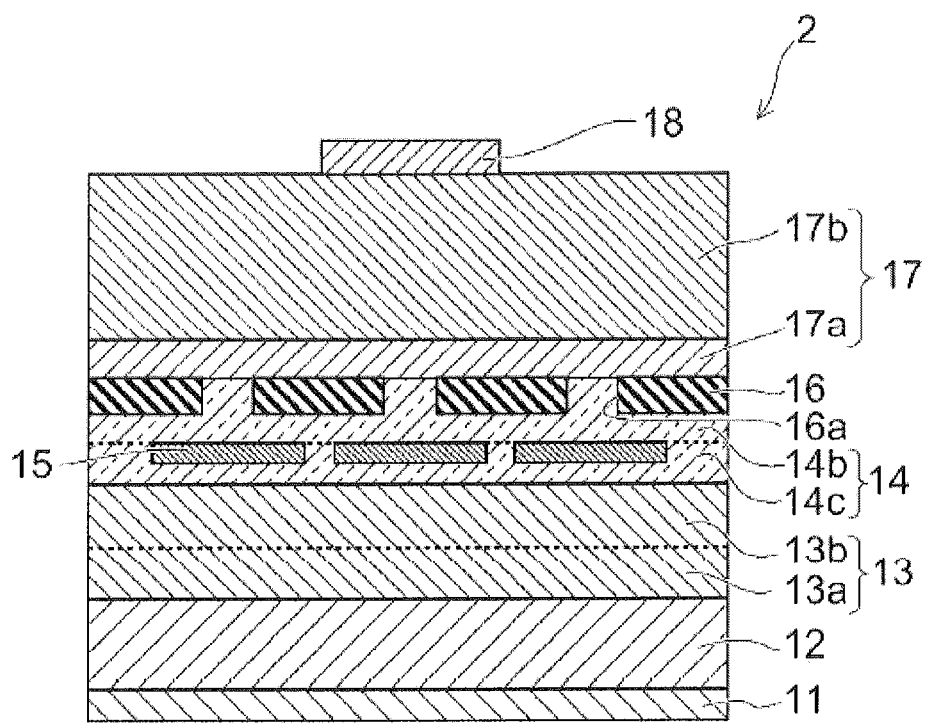
FIG. 5B is a cross section along A-A' line shown in FIG. 5A.

FIG. 5A is a plane drawing showing an example of the semiconductor light emitting device of a second embodiment, and FIG. 5B is a cross section along the A-A' line shown in FIG. 5A. In FIG. 5A, the upper electrode 18 is omitted for convenience of illustration.

As shown in FIGS. 5A and 5B, the semiconductor light emitting device 2 of the second embodiment is different from the semiconductor light emitting device 1 of the first embodiment (see FIGS. 1A and 1B) in that the reflective metal layer 15 is divided into multiple parts. Each part of the reflective metal layer 15 is formed at each opening 16a of the transparent insulating layer 16, and is positioned in the nadir of the opening 16a and the periphery of the opening 16a. Also, seen from the layering direction, each part of the reflective metal layer 15 has a rectangular shape.

According to the second embodiment, compared to the first embodiment discussed above, the contact area of the upper layer 14c and the lower layer 14b of the transparent conductive layer 14 is large, so the adhesion of the upper layer 14c and the lower layer 14b is high. Therefore, it is possible to secure the transparent conductive layer 14 and the reflective metal layer 15 more strongly, so the separation of the interface of the transparent conductive layer 14 and the reflective metal layer 15 becomes harder to occur, further improving the productivity. On the other hand, in the first embodiment discussed above, compared to the second embodiment, the reflective metal layer 15 is continuously formed, so the reflective metal layer 15 has high light extraction efficiency.

In the second embodiment also, immediately below the opening 16a where a current flows, reflective metal layer 15 is positioned, so it is possible to suppress the decrease in the light extraction efficiency, caused by dividing the reflective metal layer 15.

The structure, production method, operation and effect of the second embodiment, other than mentioned above, are substantially the same as the first embodiment.

Third Embodiment

Figure 6A:
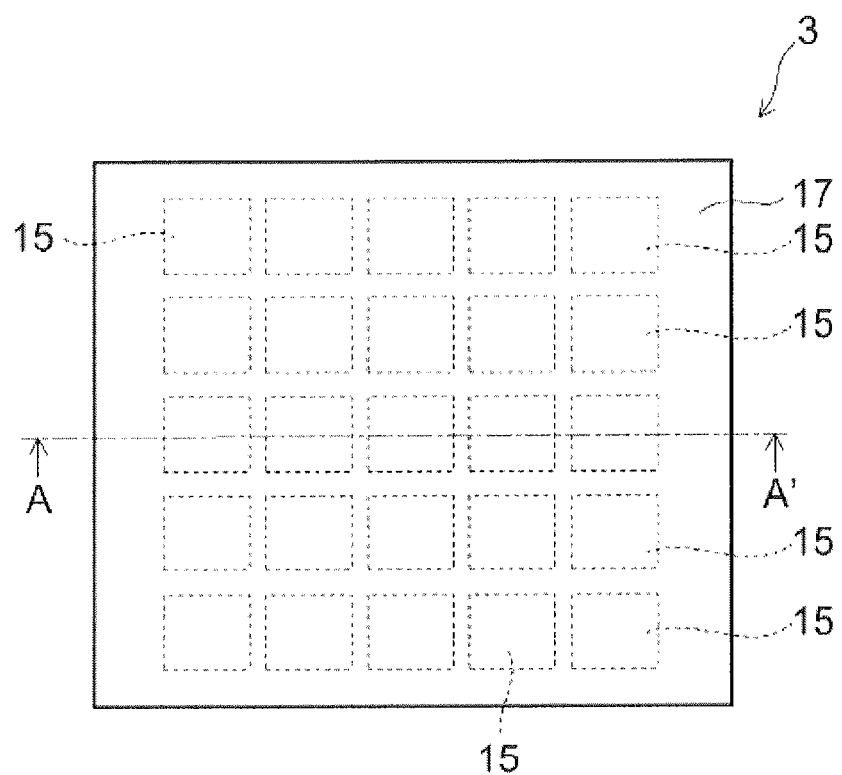
FIG. 6A is a plane drawing showing an example of a semiconductor light emitting device according to a third embodiment.
Figure 6B:
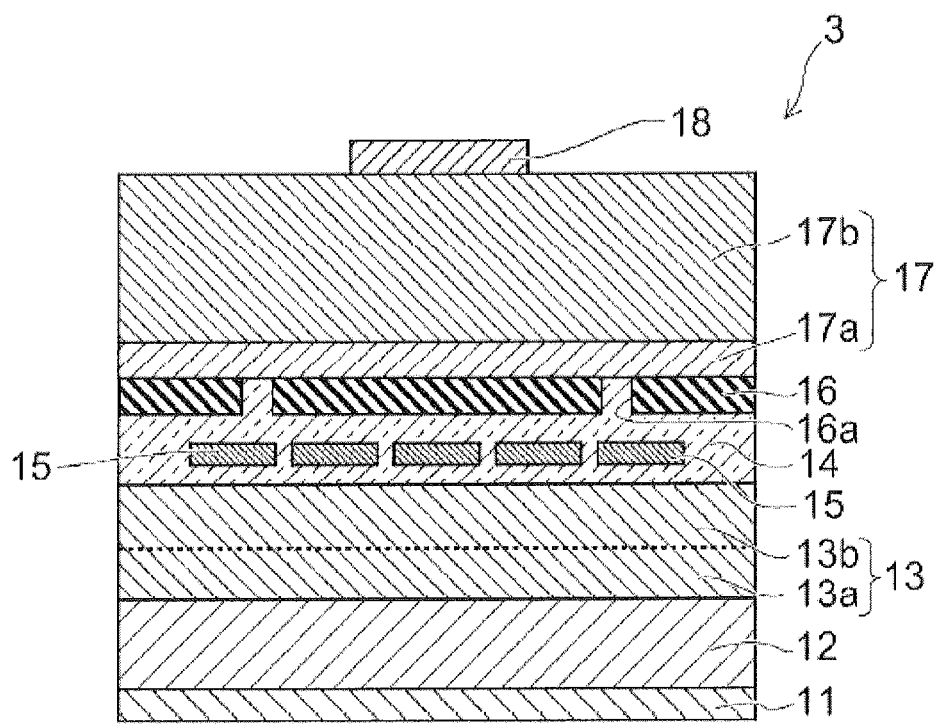
FIG. 6B is a cross section along A-A' line shown in FIG. 6A.

FIG. 6A is a plane drawing showing an example of the semiconductor light emitting device of a third embodiment, and FIG. 6B is a cross section along the A-A' line of FIG. 6A. In FIG. 6A, the upper electrode 18 is omitted for convenience of illustration.

As shown in FIGS. 6A and 6B, semiconductor light emitting device 3 of the third embodiment is different from the semiconductor light emitting device 2 of the second embodiment (see FIGS. 5A and 5B) in that the reflective metal layer 15 is even more finely divided, and that the number of parts of the divided reflective metal layer 15 is larger than the number of the openings 16a of the transparent insulating layer 16. In this way, it is possible to secure the transparent conductive layer 14 and the reflective metal layer 15 even more strongly.

The structure, production method, operation and effect of the third embodiment, other than discussed above, are substantially the same as the second embodiment.

Fourth Embodiment

Figure 7A:
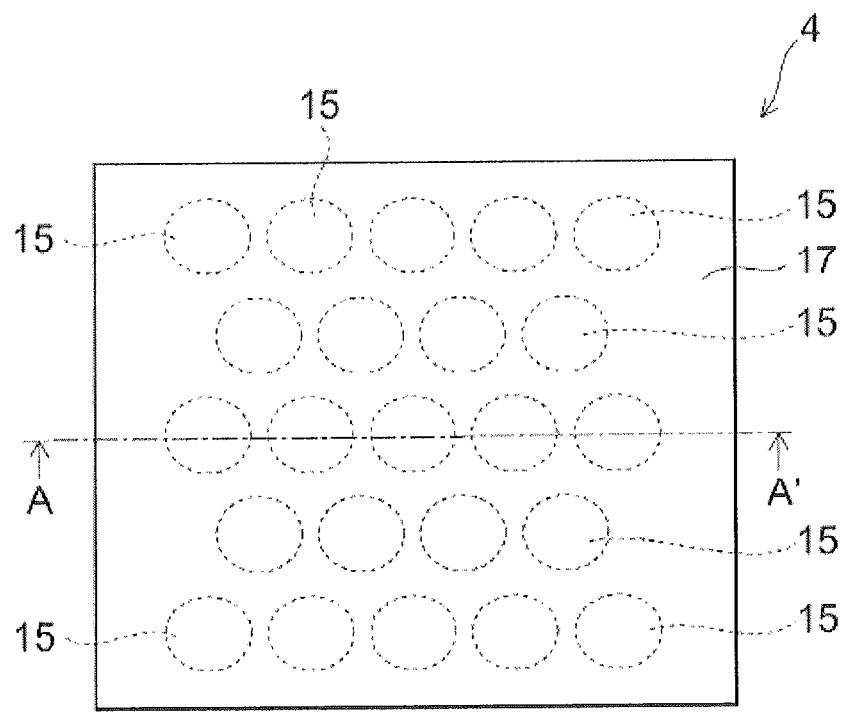
FIG. 7A is a plane drawing showing an example of a semiconductor light emitting device according to a fourth embodiment and FIG. 7B is a cross section along A-A' line shown in FIG. 7A.
Figure 7B:
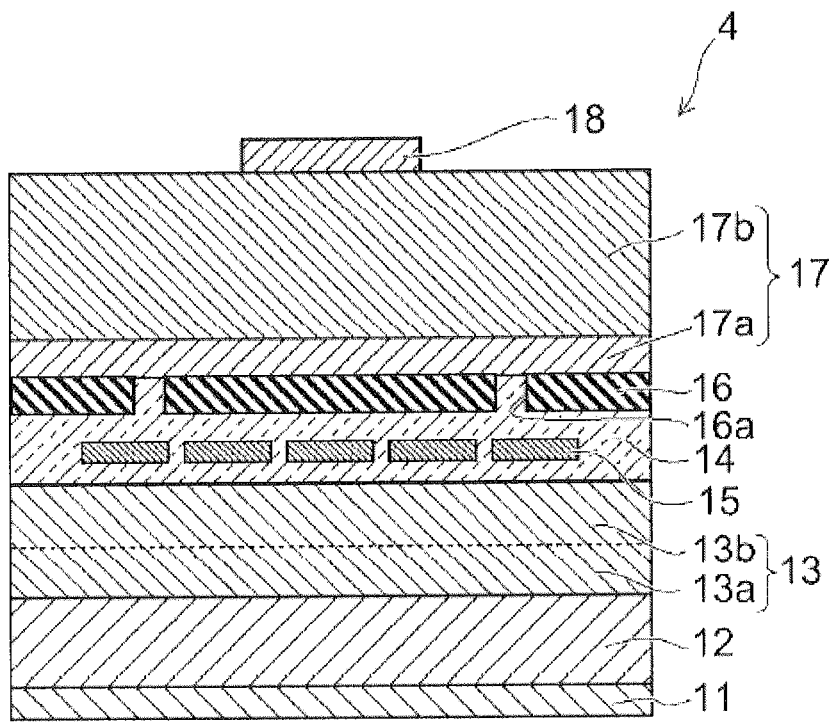

FIG. 7A is a plane drawing showing an example of a semiconductor light emitting device of the fourth embodiment, and FIG. 7B is a cross section along the A-A' line shown in FIG. 7A. In FIG. 7A, the upper electrode 18 is omitted for convenience of illustration.

As shown in FIGS. 7A and 7B, semiconductor light emitting device 4 of the fourth embodiment is different from semiconductor light emitting device 3 of the third embodiment (see FIGS. 6A and 6B) in that seen from the layering direction, the shape of each part of the reflective metal layer 15 is oval. Here, an oval shape includes the perfect circle form.

The structure, production method, operation and effect of the fourth embodiment, other than discussed above, are substantially the same as the third embodiment.

As shown in each embodiment discussed above, the size of the reflective metal layer 15 can be determined freely, taking into consideration the tradeoff between mechanical strength and light extraction efficiency. Also, the shape of each part of reflective metal layer 15 can be determined freely, and is not limited to a rectangular or oval shape.

Here, the material for each part of the semiconductor light emitting device is not limited to the examples shown in each embodiment discussed above. For example, in each embodiment discussed above, an example in which the support substrate 12 is composed of silicon is presented, but the support substrate 12 is not limited to this example. In another example, the support substrate 12 can be composed of copper (Cu).

Also, in each embodiment discussed above, an example in which the binding metal layer 13 has a single layer of gold is shown, but the binding metal layer 13 is not limited to this example. In another example, the binding metal layer 13 can include a triple-layer of titanium (Ti), platinum (Pt), and/or gold (Au) layers. In this case, the titanium layer prevents the diffusion of silicon and gold, and the platinum layer improves the adhesion of the titanium and gold layers. Also, on the exposed surface of the lower layer 13a and the upper layer 13b of the binding metal layer 13 before the binding, indium (In) or tin (Sn) can be layered. In this way, avoid can be prevented from occurring at the interface 13c.

Further, in each embodiment discussed above, an example in which the transparent conductive layer 14 is composed of ITO is presented, but the transparent conductive layer 14 is not limited to this example. In another example, the transparent conductive layer 14 can be composed of zinc-based oxides such as ZnO, or indium-based oxides such as InGaZnO.

Further, in each embodiment discussed above, an example in which the reflective metal layer 15 is composed of silver is presented, but the reflective metal layer 15 is not limited to this example. In another example, any materials can be used for the reflective metal layer 15 as long as they have a higher reflectance to the light emitted from the semiconductor light emitting layer 17 than the reflectance of the binding metal layer 13. The reflective metal layer 15 can be, for example, composed of aluminum (Al) or platinum (Pt).

Further, in each embodiment discussed above, an example in which the semiconductor light emitting layer 17 is a layered film with GaP and InGaAlP layers is presented, but the semiconductor light emitting layer 17 is not limited to this example. In another example, the materials for the semiconductor light emitting layer 17 can include, for example, GaP, GaN, InGaN, InGaAlP and/or GaAlAs.

Further, in each embodiment discussed above, an example in which the semiconductor light emitting layer 17 emits red light is presented, but the semiconductor light emitting layer 17 is not limited to this example. The semiconductor light emitting layer 17, for example, can emit visible light other than red, near infrared rays with a wavelength of approximately 1.3 to 1.58 µm, used for optical communications, or ultraviolet rays.

Furthermore, in each embodiment discussed above, an example in which the crystal growing substrate 31 is composed of gallium arsenic (GaAs) is presented, but the crystal growing substrate 31 is not limited to this example. In another example, crystal growing substrate 31 can be composed of sapphire, silicon carbide (SiC), gallium nitride (GaN), and/or silicon (Si).

According to the embodiment explained above, it is possible to actualize a semiconductor light emitting device with a high productivity and high light extraction efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
   a support substrate;
   a first metal layer formed on the support substrate;
   a transparent conductive layer formed on the first metal layer;
   a second metal layer embedded in the transparent conductive layer, such that edges of the second metal layer are not exposed; and
   a semiconductor light emitting layer formed on the transparent conductive layer.

2. The semiconductor light emitting device according to claim 1, wherein a reflectance of the second metal layer to light emitted by the semiconductor light emitting layer is higher than a reflectance of the first metal layer to light emitted by the semiconductor light emitting layer.

3. The semiconductor light emitting device according to claim 2, wherein an entire edge of the second metal layer is covered by the transparent conductive layer.

4. The semiconductor light emitting device according to claim 3, wherein the second metal layer is continuously formed within the transparent conductive layer.

5. The semiconductor light emitting device according to claim 3, further comprising a transparent insulating layer selectively formed between the transparent conductive layer and the semiconductor light emitting layer, wherein the transparent conductive layer is connected to the semiconductor light emitting layer in areas where the transparent insulating layer are not formed, and the second metal layer is present directly below the areas where the transparent insulating layer are not formed.

6. The semiconductor light emitting device according to claim 5, wherein the second metal layer has a plurality of separate sections each present directly below one of the areas where the transparent insulating layer are not formed.

7. The semiconductor light emitting device according to claim 1, wherein the first metal layer is a binding metal layer including gold, and wherein the transparent conductive layer includes indium-tin-oxide and the second metal layer includes one of silver and a silver alloy.

8. A semiconductor light emitting device, comprising:
   a support substrate;
   a first metal layer formed on the support substrate;
   a transparent conductive layer formed on the first metal layer;
   a second metal layer embedded in the transparent conductive layer, a width of the second metal layer being less than a width of the first metal layer; and
   a semiconductor light emitting layer formed on the transparent conductive layer.

9. The semiconductor light emitting device according to claim 8, wherein a reflectance of the second metal layer to light emitted by the semiconductor light emitting layer is higher than a reflectance of the first metal layer to light emitted by the semiconductor light emitting layer.

10. The semiconductor light emitting device according to claim 8, wherein the second metal layer is continuously formed within the transparent conductive layer.

11. The semiconductor light emitting device according to claim 8, wherein the second metal layer is formed as a plurality of physically separate sections.

12. The semiconductor light emitting device according to claim 11, wherein each of the physically separate sections has one of a square-plate shape, a rectangular plate shape, and a circular plate shape.

13. A method of manufacturing a semiconductor light emitting device, the method comprising:
    forming a support substrate;
    forming a first metal layer on the support substrate;
    forming a second metal layer on the first metal layer to have a width that is narrower than that of the first metal layer; and
    forming a transparent conductive layer on the second metal layer and on the first metal layer around edges of the second metal layer; and
    forming a semiconductor light emitting layer on the transparent conductive layer.

14. The method of claim 13, wherein a reflectance of the second metal layer to light emitted by the semiconductor light emitting layer is higher than a reflectance of the first metal layer to light emitted by the semiconductor light emitting layer.

15. The method of claim 13, wherein said forming the second metal layer having a width that is narrower than that of the first metal layer includes:
    forming the second metal layer on the first metal layer to have a same width as that of the first metal layer; and
    etching edge portions of the second metal layer.

16. The method of claim 13, wherein the second metal layer is formed as a plurality of physically separate sections.

17. The method of claim 16, wherein each of the physically separate sections has one of a square-plate shape, a rectangular plate shape, and a circular plate shape.

18. The method of claim 16, further comprising selectively forming a transparent insulating layer between the transparent conductive layer and the semiconductor light emitting layer, wherein the transparent conductive layer is connected to the semiconductor light emitting layer in areas where the transparent insulating layer is not formed, and each of the sections of the second metal layer is formed directly below one of the areas where the transparent insulating layer are not formed.

19. The method of claim 18, wherein the transparent insulating layer includes an undoped oxide.

20. The method of claim 13, wherein the first metal layer is a binding metal layer including gold, and wherein the transparent conductive layer includes indium-tin-oxide, and the second metal layer includes one of silver and a silver alloy.

* * * * *